(12) United States Patent
Poddar et al.

(10) Patent No.: US 10,580,722 B1
(45) Date of Patent: Mar. 3, 2020

(54) HIGH VOLTAGE FLIP-CHIP ON LEAD (FOL) PACKAGE

(71) Applicant: Texas Instruments Incorporated, Dallas, TX (US)

(72) Inventors: Anindya Poddar, Sunnyvale, CA (US); Thomas Dyer Bonifield, Dallas, TX (US); Woochan Kim, Sunnyvale, CA (US); Vivek Kishorechand Arora, San Jose, CA (US)

(73) Assignee: TEXAS INSTRUMENTS INCOPORATED, Dallas, TX (US)

( * ) Notice: Subject to any disclaimer, the term of this patent is extended or adjusted under 35 U.S.C. 154(b) by 0 days.

(21) Appl. No.: 16/134,924

(22) Filed: Sep. 18, 2018

(51) Int. Cl.
| | |
|---|---|
| *H01L 21/44* | (2006.01) |
| *H01L 21/48* | (2006.01) |
| *H01L 21/50* | (2006.01) |
| *H01L 23/62* | (2006.01) |
| *H01L 29/00* | (2006.01) |
| *H01L 23/552* | (2006.01) |
| *H01L 23/544* | (2006.01) |
| *H01L 23/495* | (2006.01) |
| *H01L 23/532* | (2006.01) |

(52) U.S. Cl.
CPC .... *H01L 23/49548* (2013.01); *H01L 21/4821* (2013.01); *H01L 23/4951* (2013.01); *H01L 23/53228* (2013.01)

(58) Field of Classification Search
CPC .......... H01L 21/4871; H01L 23/49548; H01L 23/4951; H01L 23/53228
USPC .................. 257/355, 787, 659, 501; 438/113
See application file for complete search history.

(56) References Cited

U.S. PATENT DOCUMENTS

| | | | |
|---|---|---|---|
| 6,351,011 B1 * | 2/2002 | Whitney | H01C 7/12 257/355 |
| 2010/0176480 A1 * | 7/2010 | Senda | H01L 21/84 257/501 |

* cited by examiner

*Primary Examiner* — David S Blum
(74) *Attorney, Agent, or Firm* — Ronald O. Neerings; Charles A. Brill; Frank D. Cimino

(57) ABSTRACT

Described herein is a technology or a method for fabricating a flip-chip on lead (FOL) semiconductor package. A lead frame includes an edge on surface that has a geometric shape that provides a radial and uniform distribution of electric fields. By placing the formed geometric shape along an active die of a semiconductor chip, the electric fields that are present in between the lead frame and the semiconductor chip are uniformly concentrated.

20 Claims, 4 Drawing Sheets

HIGH VOLTAGE FLIP-CHIP ON LEAD (FOL) PACKAGE

BACKGROUND

A semiconductor package is a metal, plastic, glass or a ceramic casing that includes electronic components. Individual discrete electronic components are etched in a silicon wafer, and thereafter the process includes cutting of the wafer and assembling the wafer in a semiconductor package. The semiconductor package provides protection against exposure to extreme temperatures and against impact and corrosion. The semiconductor package also holds contact pins or leads.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Figure 1:
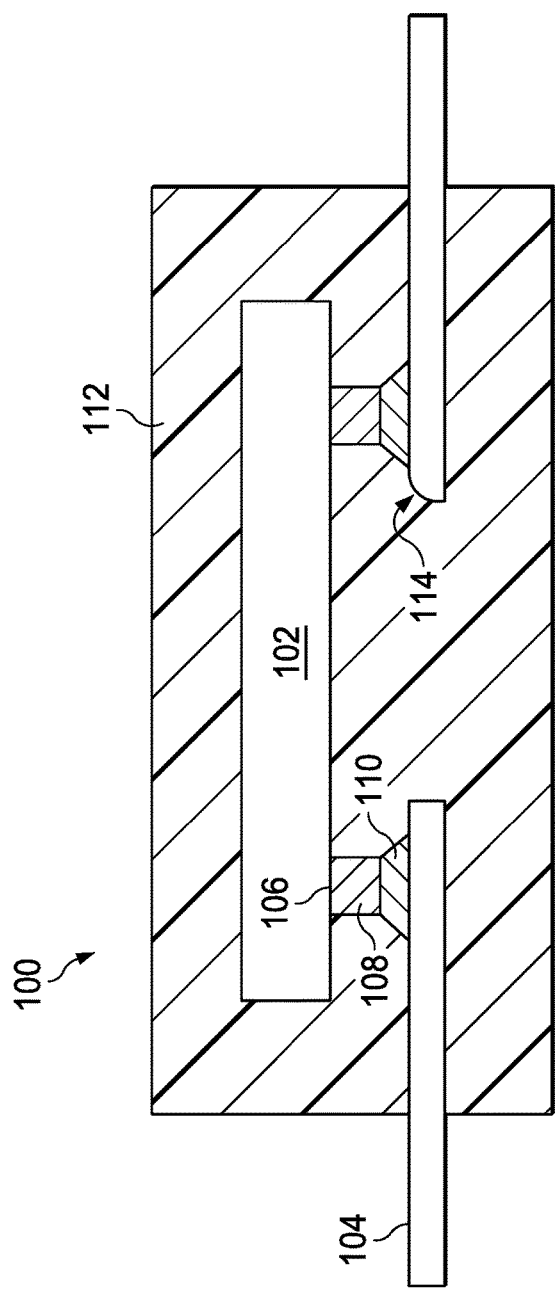
FIG. 1 illustrates an example cross-section of a semiconductor package or device that implements a high voltage flip-chip on lead or FOL package as described herein.

Described herein is a technology or a method of semiconductor package fabrication. High voltage flip chip-on-lead packages are new and include a few unanticipated challenges related to the high voltage values applied to the packages. FIG. 1 is an example cross-section of a semiconductor package 100 (i.e., device) that implements high voltage flip-chip on lead or FOL package as described herein. The high voltage FOL package, for example, is formed by flipping a die and mounting the flipped die on a lead frame to provide robust flip-chip type interconnections between electric contact points and the lead frame.

As shown, the semiconductor package 100 includes a semiconductor die 102 that is attached to a lead frame 104. A plurality of pre-determined electrical contact points 106 are further formed on the semiconductor die 102. On each of these electric contact points 106, a copper pillar 108 is formed to connect lead fingers of the lead frame 104 to the semiconductor die 102. The lead frame 104, for example, includes a thin layer of metal attached to the semiconductor die 102.

FIG. 1 further shows solder element layers 110 that are disposed in between the lead frame 104 and the copper pillar 108. Each of these solder element layers 110 can be melted at a lower temperature when compared to bumps melting of the copper pillar 108. After a reflowing of the bumps on the copper pillar 108, the connection is established between the lead frame 104 and the semiconductor die 102.

In certain embodiments, after formation of the connection between the lead frame 104 and the semiconductor die 102, the semiconductor package 100 is surrounded with an encapsulation material such as a mold compound 112. In certain implementations, the mold compound 112 can be deposited using molding equipment. In this example, the mold compound 112 provides at least structural support to the semiconductor package 100.

In certain embodiments, the lead frame 104 is configured to provide a radial and uniform distribution of electric or electromagnetic fields that is present between the lead frame 104 and the semiconductor die 102. In certain implementations, a lead frame edge 114, which is disposed along a surface of the semiconductor die 102, is formed to provide a geometric shape that uniformly distributes electromagnetic field due to above 600V potential on the high voltage portion on the lead frame 104.

Figure 2:
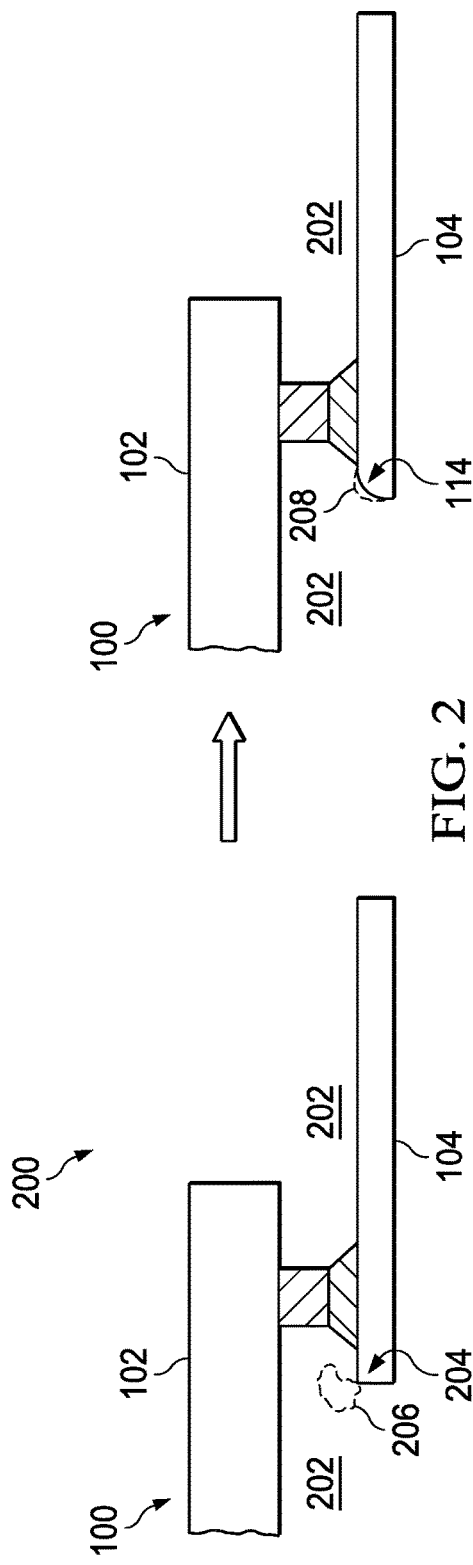
FIG. 2 illustrates an example block diagram of effects of a sharp or perpendicular shape on a lead frame on distribution electromagnetic in a semiconductor package.

FIG. 2 shows a block diagram 200 of effects of a sharp or perpendicular shape on a lead frame 104 on electromagnetic field distribution in a semiconductor package 100. In certain implementations, the semiconductor package is used in commercial electronic devices, where operation is about 600V. In terms of electrical field or "E" the equations is volts per meter (V/m). In implementations with 600V potential, normal operation within is equivalent to around $6 \times 10^6$ V/m. The operational electrical field 202 of semiconductor package is expected to be around $6 \times 10^6$ V/m. Typically, where operations are around 100V, there is not much concern for adverse electrical field build up; however, when voltages approach 600V, the effects of electrical field build up around become pronounce, and particularly at sharp edges in the lead frame 104.

Electrons will find the shortest path between conductors. A sharp metal edge between voltage nodes acts to attract electrons, analogous to a "lighting rod." Lead frame edge 204 shows a sharp or perpendicular shaped edge at lead frame 104. An electrical field 206 that builds up around lead frame edge 204 can have values up to $1 \times 10^6$ V/m which can adversely affect the operation of semiconductor package 100.

In order to reduce such an electrical field buildup at a lead frame edge, the lead frame edge is "smoothened" or given a geometric shape, such as a "rounded corner" that facilitates radial and uniform distribution of the electromagnetic fields. Lead frame edge 114 is an example of such a smoothened shape. Electrical field 208 shows a reduced electrical field buildup around the lead frame 104. The shape of lead frame edge 114 provides a radial and uniform distribution of high electromagnetic fields. This radial and uniform distribution of electromagnetic fields can decrease presence of the high electromagnetic fields between the lead frame 104 and the semiconductor die 102.

Figure 3:
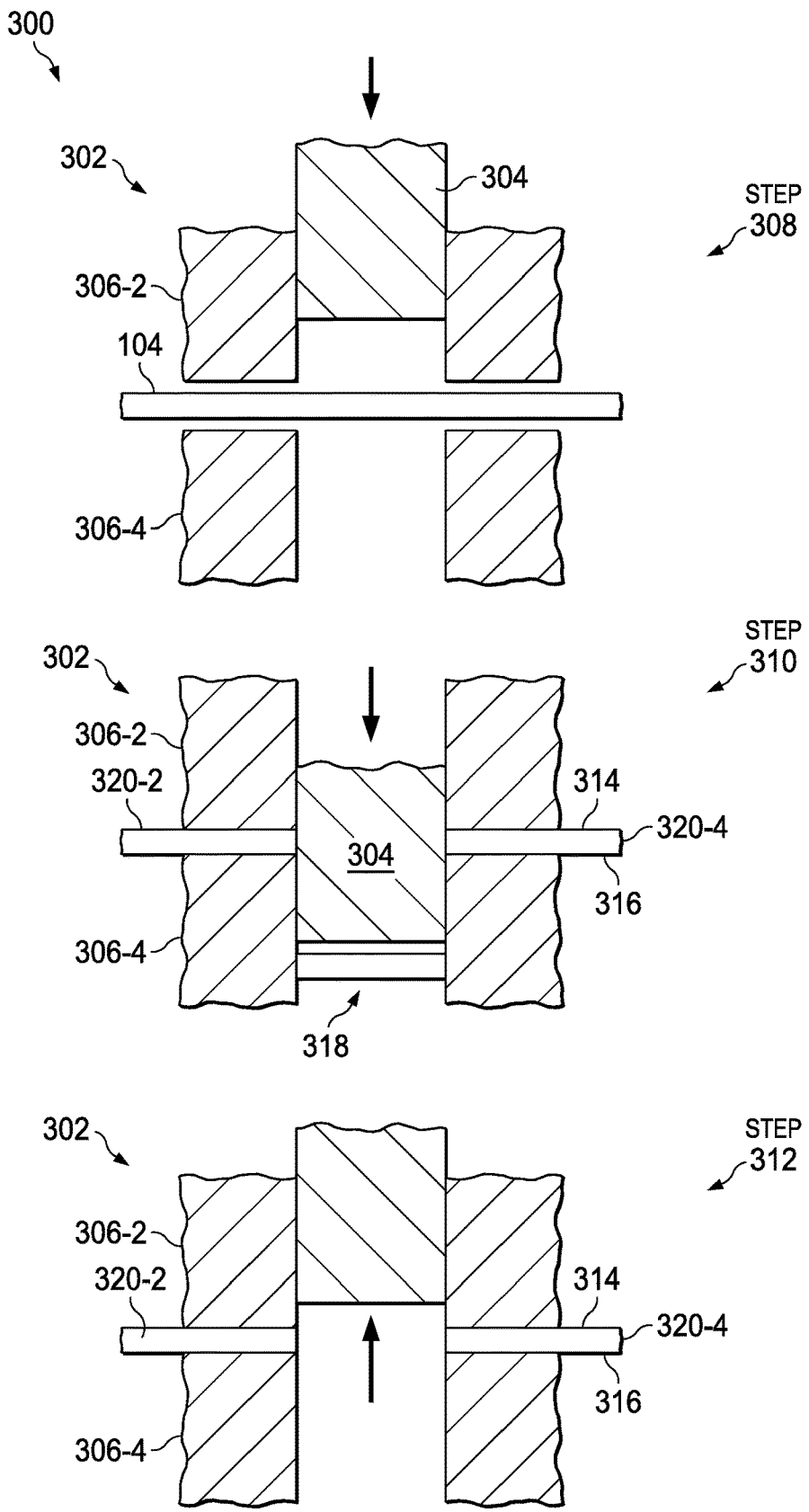
FIG. 3 illustrates an example frame fabrication process for building of a lead frame that can be used in a high voltage flip-chip on lead or FOL package as described herein.

In certain implementations, sharp edges on lead frames are the result of a stamping or fabrication process. FIG. 3 is an example lead frame fabrication process 300 for building of the lead frame 104 used in a high voltage FOL package as described herein. As shown, a stamp die cutter 302 performs a mechanical cutting process on the frame lead 104. In particular, the stamp die cutter 302 utilizes a punch 304 with stripper dies 306-2 and 306-4 that clamp the lead frame 104 during the mechanical cutting process.

The lead frame 104 facilitates a connection between a frame mounted semiconductor chip or chip, which includes the semiconductor die 102, and an external host system (not shown). The lead frame 104 can be produced by stamping a pattern on a strip of copper or iron-nickel alloy. The pattern depends upon a desired configuration appropriate for the size of the lead frame mounted chip, and its connection to the external host system.

For example, the lead frame 104 is a lead frame utilized on a lead-frame based semiconductor package such as the high voltage FOL package. In this example, the lead frame is patterned in such a way that it can uniformly distributes electric fields (not shown) that may be present on the FOL package. This uniform distribution of the electric fields can prolong the life of the FOL package.

As described herein, the lead frame fabrication process 300 includes a first step 308, a second step 310, and a third step 312 for the patterning of the lead frame 104.

Referencing the first step 308, the stamp die cutter 302 performs a mechanical cutting process. That is, the upper stripper die 306-2 is configured to move downward towards a fixed lower stripper die 306-4 in order to clamp down the lead frame 104 disposed between the upper stripper die 306-2 and the fixed lower stripper die 306-4. For example, the upper stripper die 306-2 presses the lead frame 104 against the fixed lower stripper 306-4 with a certain amount of pressure to a secure stable position of the lead frame 104. The certain amount of pressure can be proportional to thickness of the lead frame 104 in order to avoid lead frame deformation. In this example, the secured stable position of the lead frame 104 is in preparation for the mechanical cutting process performed by the punch 304.

Referencing the second step 310, the punch 304 is a cutting blade with a sharp bottom edge that penetrates through the lead frame 104 at a stamping point. The punch 304 slides back and forth on the clamping stripper dies 306-2 and 306-4 in order to cut the lead frame 104. The punch 304 moves downwards and perpendicular to a first surface 314 and a lower second surface 316 of the lead frame 104. That is, the punch 304 performs the cutting process from a first surface to a second surface direction to shear a scrap portion 318 from sections 320-2 and 320-4 of the lead frame 104.

In fabrication processes, such as fabrication process 300, there will be instances when a rounded first surface and a sharp second surface of the lead frame is produced. In certain instances, the rounded first surface and sharp second surface are results from how the stripper dies 306 hold the lead frame, the tolerances of the punch 304, the pressure at which the lead frame is punched, and other factors.

Therefore, in certain embodiments, the semiconductor die 102 is mounted to the lead frame 104 at the surface 314 with the rounded corner. The surface 314 is referred to as a first surface or top surface of the lead frame 104, while the second surface 316 with a sharp corner is referred to as a second surface or bottom surface of the lead frame 104.

In an implementation, the scrap portion 318 includes a length equal in width of the cutting punch 304. In this implementation, the sections 320 are the remaining portions of the lead frame 104 after taking out the length of the scrap portion 318. In this implementation, the scrap portion 318 is blown away and discarded after the punch 304 shears it off from the sections 320-2 and 320-4.

Thereafter, at step 312, the punch 304 goes back to its original position and the stripper die 306-2 moves upwards to loosens its grip on the lead frame 104.

Punching of the sections 320 forms the geometric shape that provides the radial and uniform distribution of the high electric fields that may be present in between the semiconductor die 102 and the lead frame 104.

Figure 4:
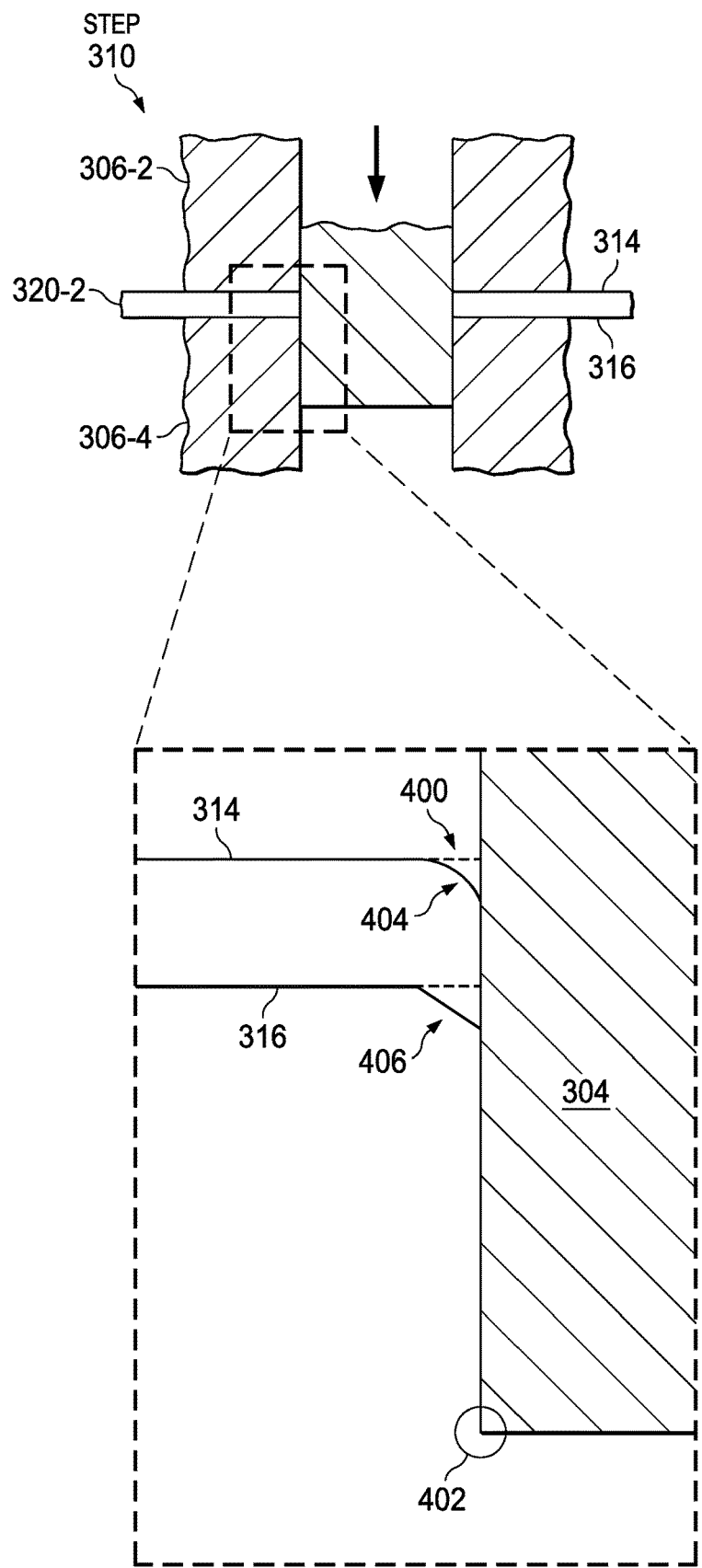
FIG. 4 illustrates an example illustration of a fabrication step that includes formation of geometric shapes at a stamping point edge on the frame as described herein.

FIG. 4 is an example illustration of the step 310 that includes formation of geometric shapes at a stamping point edge on the lead frame 104 as described herein. As shown, a stamping point 400 includes a first cutting entry for an edge 402 of the punch 304. The first cutting entry can be a penetrating point where the edge 402 of the punch 304 begins to cut or shear down the section 320-2 from the scrap portion 318 of the lead frame 104. In this case, the cutting direction of the edge 402 of the punch 304 is perpendicular to a plane defined by the first surface 314 of the lead frame 104.

When the edge 402 passes through the second surface 316 of the lead frame 104 in a cutting motion, a resulting first geometric shape 404 at the first surface 316 is formed. Similarly, at the second surface 316, a second geometric shape 406 is formed at a shearing point or a separation point between the sections 320 and the scrap portion 318 of the lead frame 104.

In an implementation, the geometric shape 404 is a rounded corner that provides radial and uniform distribution of high electromagnetic fields. For example, the rounded corner is a semi-circle deformation at the stamping point or starting cutting point of the section 320-2. The stamping point is where the edge 402 of the punch 304 begins to cut through the lead frame 104. In this example, the semi-circle deformation or rounded corner generates the radial and uniform distribution of the high electric fields that may be generated by a high voltage portion of the lead frame 104.

Referencing the shearing point at the second surface 316, the formed second geometric shape 406 at the bottom edge of the section 320-2 of the lead frame 104 includes an undesirable sharp shape. In certain implementations, the shearing point includes a portion of the lead frame material that protrudes or extends beyond the shearing point on an initial plane defined by the second surface 316 of the lead frame 104. In this example, the second geometric shape 406 does not provide the radial and uniform distribution of the electromagnetic fields. The second geometric shape 406 is a sharpen corner. If surface 316 is used to mount the lead frame to the semiconductor die 102, as discussed there is a higher risk of electrical field build up that can cause reliability failure of the semiconductor package 100.

Figure 5:
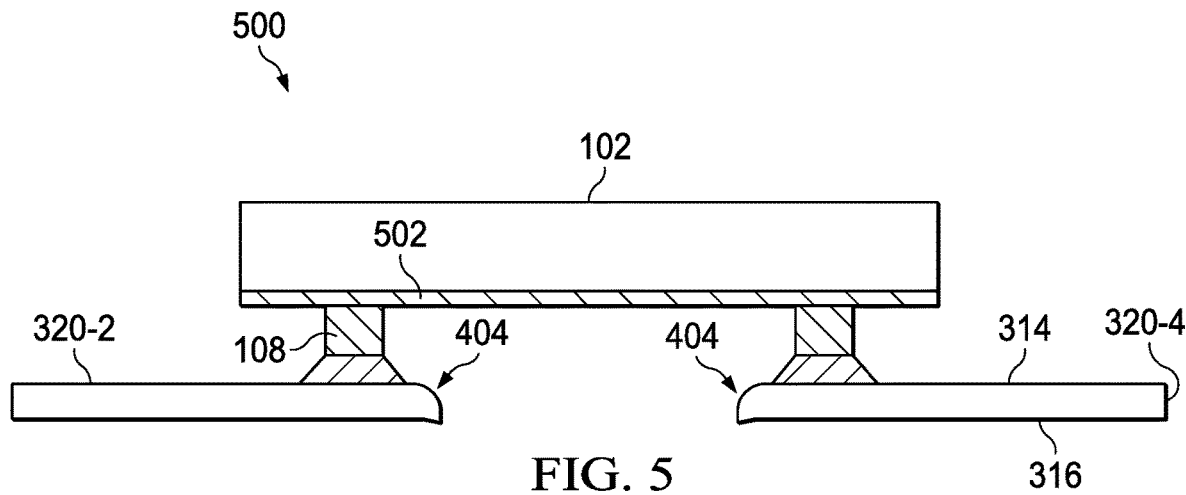
FIG. 5 illustrates an example cross-section of a semiconductor package or device that implements high voltage flip-chip on lead or FOL package as described herein.

FIG. 5 shows an example cross-section of a semiconductor package 500 (or device) that implements high voltage FOL package as described herein. The semiconductor package 500 is similar to the semiconductor package 100 and includes the sections 320 of the lead frame 104. Particularly, the semiconductor die 102 is attached onto the lead frame 104 such that the formed first geometric shape 404 on the first surface or top surface of the lead frame 104 is disposed onto an active side 502 of the semiconductor die 102.

In an implementation, the semiconductor die 102 is flipped so that its active side 502 is attached to the top surface (i.e., first surface 314) of the corresponding sections 320 of the lead frame 104. In this implementation, and during operations of the semiconductor package 500, the first geometric shape 404 is exposed to a high voltage portion of the lead frame 104.

As described in FIG. 4, the first geometric shape 404 provides radial and uniform distribution of high electromagnetic fields that can be present at the first surface 314 of the lead frame 104. In this regard, the first geometric shape 104 facilitates uniform distribution or concentration of these high electromagnetic fields in order to at least prolong life or prevent failure of the semiconductor package 500. As shown in FIG. 5, the second geometric shape 406 (i.e., bottom surface of the lead frame 104) is disposed on the opposite side or second surface of the active die 502 of the semiconductor die 102. As described herein, the second geometric shape 404, which includes an undesirable shape, is exposed to a low voltage portion of the lead frame 104.

In other implementations, an additional semiconductor step of smoothing the second geometric shape 406 can be performed. For example, the protruding shape of the second geometric shape 406 can be further polished by a polishing machine (not shown). In this example, effects of the undesirable shape can be minimized. In certain implementations, the surface 316 with geometric shape 306 is used to mount die 102 to lead frame 104.

It is to be understood, that is desirable to determine if an undesirable shape exists that can lead to high electrical field distribution, and avoid using such a shape when mounting a semiconductor die, such as semiconductor die 102 to a lead frame, such as lead frame 104.

The fabrication process 300 is an example of fabricating a geometric shape that provides a radial and uniform distribution of high electromagnetic fields. In certain embodiments, after a stamping process such as fabrication process 300 a chemical etch is performed to etch away sharp corners. In other embodiments, a laser or implementation of a more precise cut other than a saw blade is used. In other embodiments, the shape of the punch 304 is shaped, such as a trapezoid, to provide additional rounding on a side of a lead frame 104.

Figure 6:
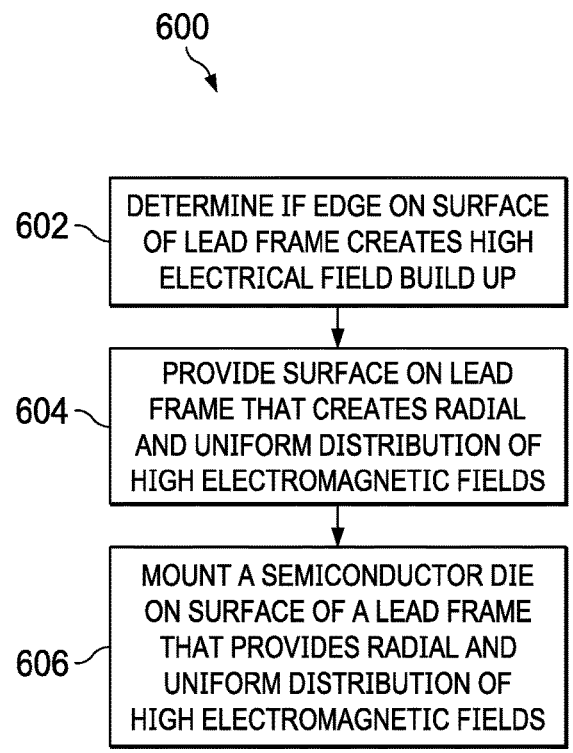
FIG. 6 illustrates an example process chart illustrating an example method for semiconductor package fabrication as described herein.

FIG. 6 shows an example process chart 600 illustrating an example method for semiconductor package fabrication as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 602, a determination is made if an edge on a lead frame creates a high electrical field build up, if the surface that the edge is located is used to mount a semiconductor die. Such an edge has a shape, such as a sharp edge, a perpendicular or orthogonal shape that has a high tendency to attract electrons. Such a shape can create an undesirable high electrical field build up. This determination can be made in regards to a lead frame fabrication process, where stamping a lead frame from a first surface to a second surface direction to shear a scrap portion from the lead frame creates a undesirable edge at of the lead frame. As described above, the lead frame 104 is stamped from the first surface 314 to the second surface 316. In this example, the stamping direction is perpendicular to a plane defined by the first surface 314. The second surface 316 has an undesirable edge or geometric shape 406.

At block 604, providing a surface with an edge or desirable geometric shape that creates a radial and uniform distribution of high electromagnetic fields is performed. In certain implementations, the stamping or fabrication process 300 described above, the first surface 314 forms geometric shape 304, which provides uniform distribution of the high electric fields or radial and uniform distribution of high electromagnetic. In certain implementations, a desirable geometric shape is achieved by polishing and shaping an undesirable shape on a surface of the lead frame. In other embodiments, the desirable geometric shape is achieved by a chemical etch to etch away sharp corners. In other embodiments, a laser or implementation of a more precise cut other than a saw blade is used. In other embodiments, the shape of a punch, such as punch 304 is shaped, for example as a trapezoid, to provide additional rounding on a side of a lead frame.

At block 606, a semiconductor die is mounted on a surface of lead frame, where the surface provides a desirable geometric shape is performed.

What is claimed is:

1. A method of making a packaged semiconductor device comprising:
    providing a lead frame with a first surface that includes an edge shape that provides for radial and uniform distribution of electric fields on the lead frame within the packaged semiconductor device; and
    mounting a semiconductor die on the first surface of the lead frame.

2. The method of claim 1, wherein in the first surface is created by punching the lead frame to form the edge shape that provides radial and uniform distributed electrical fields.

3. The method of claim 2, wherein a trapezoidal punch is used in punching the lead frame.

4. The method of claim 1, wherein the lead frame includes a second surface that has an edge that creates high electrical field build up if the second surface is used to mount the semiconductor die.

5. The method of claim 4, wherein the edge of the second surface is a sharpened or orthogonal shape.

6. The method of claim 1, wherein the edge shape that provides for a radial and uniform distribution of electric fields is a rounded shaped edge.

7. The method of claim 1, wherein the edge that provides for radial and uniform distributed electrical fields is formed by polishing and shaping a sharpened or orthogonal edge.

8. The method of claim 1, wherein the edge that provides for radial and uniform distributed electrical fields is formed by a chemical etch to etch away sharp corners.

9. The method of claim 1, wherein the edge that provides for radial and uniform distributed electrical fields is formed by a laser cut.

10. A device comprising:
    a lead frame with a first surface that includes an edge shape that provides for a radial and uniform distribution of electric fields on the lead frame within the device; and
    a semiconductor die mounted on the first surface of the lead frame.

11. The device of claim 10, wherein operational voltage of the device is around 600V.

12. The device of claim 10, wherein the edge shape is a rounded corner shape.

13. The device of claim 10, wherein the lead frame includes a second surface with an edge shape that creates high electrical field build up within the device.

14. The device of claim 13, wherein high electrical field build up is around $1 \times 10^7$ V/m.

15. The device of claim 10, wherein the lead frame used on a flip-chip on lead (FOL) package.

16. A semiconductor package comprising:
    a lead frame with a first surface that includes a geometric shape that provides for a radial and uniform concentration of electric fields on the lead frame;
    a semiconductor die mounted on the lead frame, wherein the semiconductor die is disposed onto the first surface of the lead frame; and
    a mold compound formed around the lead frame and semiconductor die.

17. The semiconductor package of claim 16, wherein operational voltage in the semiconductor die is around 600V.

18. The semiconductor package of claim 16, wherein the lead frame includes a second surface with an edge shape that creates high electrical field build up within the device.

19. The semiconductor package of claim 16, wherein high electrical field build up is around $1 \times 10^7$ V/m.

20. The semiconductor package of claim 16, wherein the lead frame used on a flip-chip on lead (FOL) package.

* * * * *